(12) United States Patent
Nayfeh et al.

(10) Patent No.: US 10,262,871 B1
(45) Date of Patent: Apr. 16, 2019

(54) FORMATION OF FIELD-TUNABLE SILICON CARBIDE DEFECT QUBITS WITH OPTICALLY TRANSPARENT ELECTRODES AND SILICON OXIDE SURFACE PASSIVATION

(71) Applicant: THE UNITED STATES OF AMERICA AS REPRESENTED BY THE SECRETARY OF THE NAVY, Washington, DC (US)

(72) Inventors: Osama Nayfeh, San Diego, CA (US); Anna Leese De Escobar, San Diego, CA (US); Brad Liu, San Diego, CA (US); Patrick Sims, San Diego, CA (US); Sam Carter, Waldorf, MD (US); David Kurt Gaskill, Alexandria, VA (US); Tom Reinecke, Alexandria, VA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 15/884,680

(22) Filed: Jan. 31, 2018

(51) Int. Cl.
*H01L 21/311* (2006.01)
*H01L 21/027* (2006.01)
(Continued)

(52) U.S. Cl.
CPC ...... *H01L 21/31144* (2013.01); *C23C 16/325* (2013.01); *C30B 25/105* (2013.01); *C30B 29/36* (2013.01); *G02F 1/0054* (2013.01); *G06N 10/00* (2019.01); *H01L 21/0276* (2013.01); *H01L 21/02447* (2013.01); *H01L 21/02529* (2013.01);
(Continued)

(58) Field of Classification Search
None
See application file for complete search history.

(56) References Cited

U.S. PATENT DOCUMENTS

2011/0220895 A1* 9/2011 Hirai ............... H01L 29/7869
257/57
2017/0261835 A1 9/2017 Koehl et al.

OTHER PUBLICATIONS

Nayfeh et al; Formation of silicon carbide defect qubits with optically transparent electrodes and atomic layer deposited silicon oxide surface passivation; Aug. 18, 2017. (Year: 2017).*

(Continued)

*Primary Examiner* — Shamim Ahmed
(74) *Attorney, Agent, or Firm* — NavInfWarCen Pacific; Kyle Eppele; Ryan Friedl

(57) ABSTRACT

A method includes depositing a layer of silicon oxide onto a layer of silicon carbide; ion implanting the layer of silicon carbide, annealing the ion implanted layer of silicon carbide to produce defects within the layer of silicon carbide, performing photolithography using a mask layer on regions of the layer of silicon carbide to define regions for electrode deposition, removing the layer of silicon oxide from the layer of silicon carbide in the one or more regions for electrode deposition, forming one or more electrodes by depositing indium tin oxide (ITO) in each of the regions for electrode deposition, performing a first lift-off operation to remove the mask layer surrounding the electrodes, depositing a passivation and gate silicon oxide layer on top of the layer of silicon carbide and the electrodes, and performing a second lift-off operation to fabricate an optically transparent ITO gate between the electrodes.

15 Claims, 11 Drawing Sheets

(51) Int. Cl.

| | |
|---|---|
| *H01L 21/768* | (2006.01) |
| *H01L 21/04* | (2006.01) |
| *H01L 21/02* | (2006.01) |
| *H01L 23/532* | (2006.01) |
| *C23C 16/32* | (2006.01) |
| *C30B 25/10* | (2006.01) |
| *C30B 29/36* | (2006.01) |
| *G02F 1/00* | (2006.01) |
| *G06N 10/00* | (2019.01) |

(52) U.S. Cl.
CPC ...... *H01L 21/049* (2013.01); *H01L 21/76826* (2013.01); *H01L 23/5329* (2013.01)

(56) References Cited

OTHER PUBLICATIONS

Falk, Abram L., Paul V. Klimov, Viktor Ivády, Krisztián Szász, David J. Christle, William F. Koehl, Ádám Gali, and David D. Awschalom. "Optical polarization of nuclear spins in silicon carbide." Physical review letters 114, No. 24 (2015).

Christle, David J., Abram L. Falk, Paolo Andrich, Paul V. Klimov, Jawad Ul Hassan, Nguyen T. Son, Erik Janzén, Takeshi Ohshima, and David D. Awschalom. "Isolated electron spins in silicon carbide with millisecond coherence times." Nature materials 14, No. 2 (2015): 160-163.

Fisher, Kent, Duncan England, Jean-Philippe Maclean, Phillip Bustard, Rune Lausten, Kevin J. Resch, and Benjamin Sussman. "Storage and retrieval of ultrafast single photons using a room-temperature diamond quantum memory." In CLEO: QELS_Fundamental Science, pp. FTh4B-5. Optical Society of America, 2015.

Gomi, Tomohiro, Syuhei Tomizawa, Kohei Ohashi, Kohei M. Itoh, Junko Ishi-Hayase, Hideyuki Watanabe, Hitoshi Umezawa, and Shinichi Shikata. "Position and density control of nitrogen-vacancy centers in diamond using micropatterned substrate for chemical vapor deposition." In Conference on Lasers and Electro-Optics/Pacific Rim, p. WI1_3. Optical Society of America, 2013.

Ohashi, K., T. Rosskopf, H. Watanabe, M. Loretz, Y. Tao, R. Hauert, S. Tomizawa et al. "Negatively charged nitrogen-vacancy centers in a 5 nm thin 12C diamond film." Nano letters 13, No. 10 (2013).

Soykal, Ö. O., Pratibha Dev, and Sophia E. Economou. "Silicon vacancy center in 4 H—SiC: Electronic structure and spin-photon interfaces." Physical Review B 93, No. 8 (2016).

Falk, Abram L., Paul V. Klimov, Bob B. Buckley, Viktor Ivády, Igor A. Abrikosov, Greg Calusine, William F. Koehl, Ádám Gali, and David D. Awschalom. "Electrically and mechanically tunable electron spins in silicon carbide color centers." Physical review letters 112, No. 18 (2014).

Klimov, P. V., A. L. Falk, B. B. Buckley, and D. D. Awschalom. "Electrically driven spin resonance in silicon carbide color centers." Physical Review Letters 112, No. 8 (2014).

Aharonovich, Igor, Dirk Englund, and Milos Toth. "Solid-state single-photon emitters." Nature Photonics 10, No. 10 (2016).

Lee, S. W., S. I. Vlaskina, V. I. Vlaskin, I. V. Zaharchenko, V. A. Gubanov, G. N. Mishinova, G. S. Svechnikov, V. E. Rodionov, and S. A. Podlasov. "Silicon carbide defects and luminescence centers in current heated 6H—SiC." Semiconductor physics quantum electronics & optoelectronics 13, No. 1 (2010).

Simmons, Stephanie, Richard M. Brown, Helge Riemann, Nikolai V. Abrosimov, Peter Becker, Hans-Joachim Pohl, Mike LW Thewalt, Kohei M. Itoh, and John JL Morton. "Entanglement in a solid-state spin ensemble." Nature 470, No. 7332 (2011).

Vrijen, Rutger, Eli Yablonovitch, Kang Wang, Hong Wen Jiang; Alex Balandin, Vwani Roychowdhury, Tal Mor, and David DiVincenzo. "Electron-spin-resonance transistors for quantum computing in silicon-germanium heterostructures." Physical Review A 62, No. 1 (2000).

Carter, S. G., Ö. O. Soykal, Pratibha Dev, Sophia E. Economou, and E. R. Glaser. "Spin coherence and echo modulation of the silicon vacancy in 4 H—SiC at room temperature." Physical Review B 92, No. 16 (2015).

Soykal, Ö. O., and Thomas L. Reinecke. "Quantum metrology with a single spin-3 2 defect in silicon carbide." Physical Review B 95, No. 8 (2017).

Schneider, J., H. D. Müller, K. Maier, W. Wilkening, F. Fuchs, A. Dörnen, S. Leibenzeder, and R. Stein. "Infrared spectra and electron spin resonance of vanadium deep level impurities in silicon carbide." Applied physics letters 56, No. 12 (1990).

Klimov, Paul V., Abram L. Falk, David J. Christle, Viatcheslav V. Dobrovitski, and David D. Awschalom. "Quantum entanglement at ambient conditions in a macroscopic solid-state spin ensemble." Science advances 1, No. 10 (2015).

Hensen, Bas, Hannes Berrien, Anaïs E. Dréau, Andreas Reiserer, Norbert Kalb, Machiel S. Blok, Just Ruitenberg et al. "Loophole-free Bell inequality violation using electron spins separated by 1.3 kilometres." Nature 526, No. 7575 (2015).

Lu, Weifang et al., "Effective optimization of surface passivation on porous silicon carbide using atomic layer deposited Al2O3", RSC Adv., vol. 7, pp. 8090-8097, 2017.

\* cited by examiner

FORMATION OF FIELD-TUNABLE SILICON CARBIDE DEFECT QUBITS WITH OPTICALLY TRANSPARENT ELECTRODES AND SILICON OXIDE SURFACE PASSIVATION

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 105623.

BACKGROUND

Defect qubits in silicon carbide are an emerging system for quantum information science and technology. An improved method is desirable to passivate and protect the device surface to preserve the particular defect configurations as well as to provide a means to tune the optoelectronic properties via electronic or opto-electronic gating.

DETAILED DESCRIPTION OF SOME EMBODIMENTS

Figures 1A, 1B:
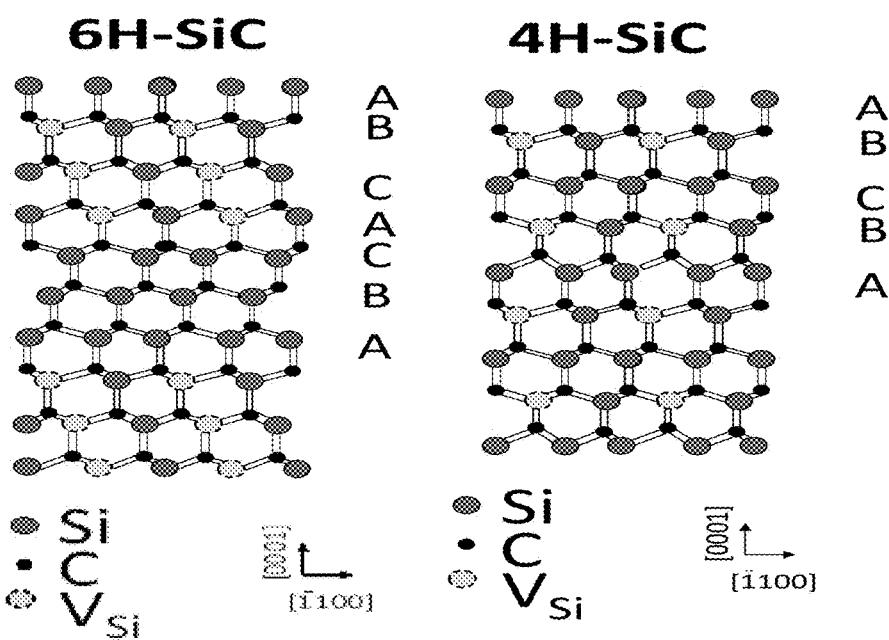
FIGS. 1A and 1B show diagrams illustrating lattice structures for 6H silicon carbide and 4H silicon carbide, respectively.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The disclosed embodiments include a method for constructing silicon carbide defect qubits by ion implantation and high temperature annealing to form vacancies. Optically transparent indium tin oxide (ITO) electrodes are integrated in a layout suitable for microwave/RF excitation and optical input/output. The surface is passivated by an atomic layer deposited silicon oxide thin film to preserve the vacancy configurations. The devices are formed through 12C ion implantation and high-temperature annealing of 4H and 6H silicon carbide. The processing of the disclosed embodiments results in good contact being formed between ITO and SiC. The photoluminescence (PL) signature of silicon vacancies is readily detected both in the silicon oxide/silicon carbide (SiC) and ITO/SiC regions and is consistent with emission in SiC only regions. The density of vacancies is estimated and lower dose implant is found to result in a consistent reduction in the vacancy densities.

A qubit is a two-level system that can be based on atoms, ions, quantum dots or even defects in crystals. The difference between these two-level systems and those based on classical objects are that they obey quantum mechanics and thus can permit quantum physics operation such as tunneling and entanglement on these two levels that effectively comprise quantum information states |0> and |1>. Using defects in crystals for qubits is advantageous in that they can be constructed using micro-nanofabrication techniques and can benefit from many of the advantages of high tech electronics such as scalability, low cost, large scale integration, compatibility with supporting components etc. There are a few types of solid state qubits being investigated worldwide and these include nitrogen vacancies in diamond, dopants in silicon, vacancies in silicon carbide and rare-earth ions in crystals. Regardless of the type of system used, the "atom-like" element must meet certain criteria to be used as a qubit.

Vacancy defects in silicon-carbide are being pursued for use as qubits due to meeting several criteria specifically regarding spin states that can be controlled (i.e. rotated and flipped) with substantial quantum coherence time of these spin states via optical and microwave excitation, a kind of hybrid process that combines concepts from nuclear/electronic magnetic resonance and spintronic that can be implemented in the solid state with atom-like defects in a host crystal.

Figure 4:
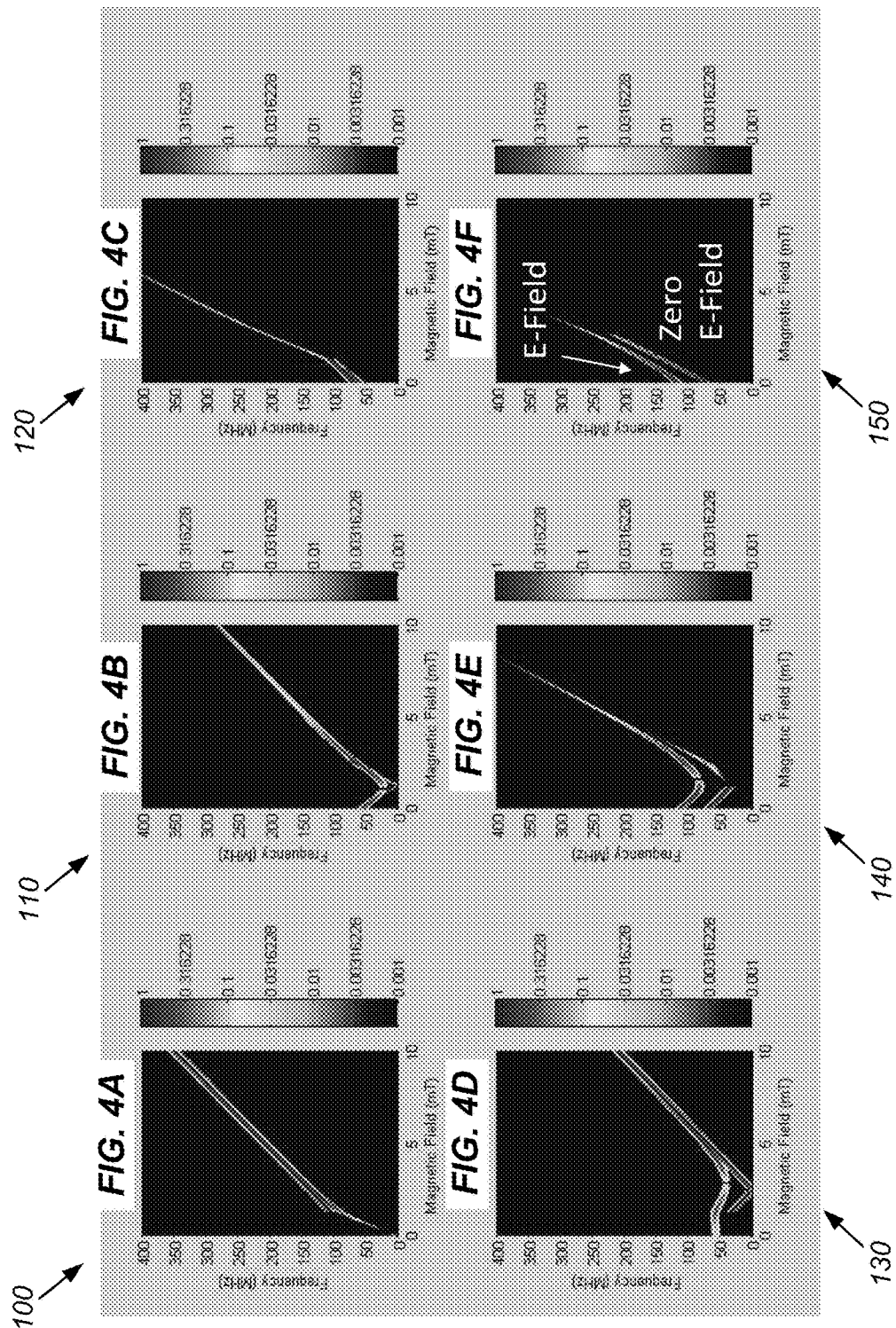
FIGS. 4A-4F shows graphs illustrating optically detected magnetic resonance simulations of the identified spin 3/2 transitions with and without a nominal electric field.
Figure 6:
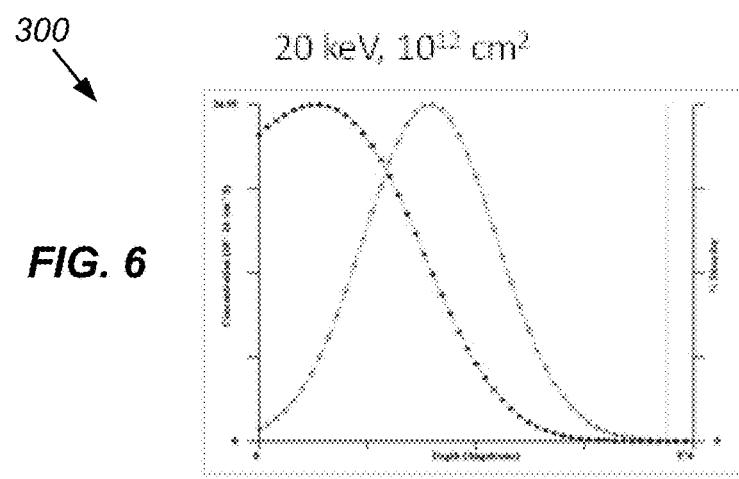
FIG. 6 shows a graph illustrating an ion implantation simulation of $^{12}C$ in silicon carbide for an implantation energy of 20 keV.

FIGS. 1A and 1B show a general description of the atomic arrangements for 6H—SiC and 4H—SiC, respectively, illustrating the lattice arrangements and the location of vacancies. As shown in FIG. 1A, 6H—SiC has ABCACBA periodicity. As shown in FIG. 1B, 4H—SiC has ABCBA periodicity. The larger shaded regions in the lattice represent Si atoms, the smaller shaded regions in the lattice represent Carbon atoms, while the dashed regions in the lattice represent Si vacancies. It should be noted that due to non-ideality in the fabrication process other defects likely exist.

Figure 2:
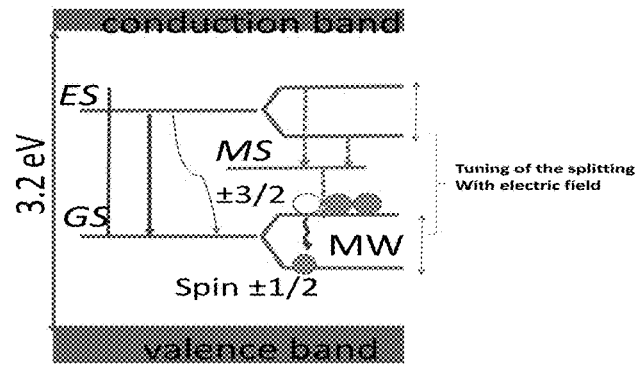
FIG. 2 shows an energy level diagram in simplified form for the silicon vacancies in silicon carbide, illustrating the optical levels between the ground state and excited state and the associated situation with hyperfine splitting and the spin configurations.
Figure 3:
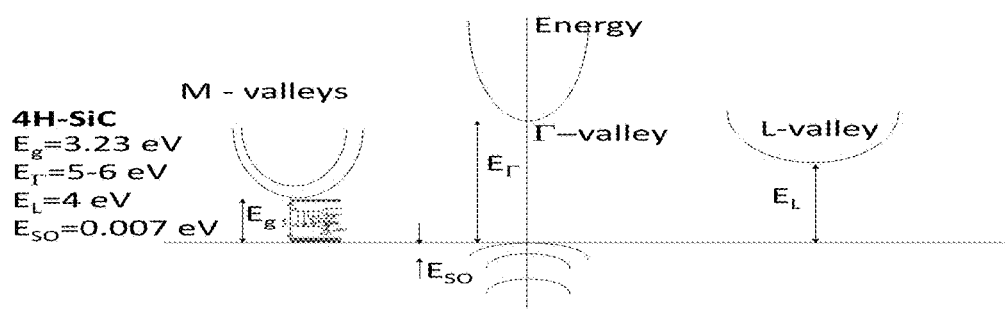
FIG. 3 shows a diagram illustrating energy levels for the full band structure of silicon carbide.

FIG. 2 shows the energy level diagram in simplified form for silicon vacancies describing the optical levels between the ground state (GS) and excited state (ES) and the associated situation with hyperfine splitting and the spin configurations. FIG. 3 shows a diagram illustrating energy levels for the full band structure of SiC.

According to recent density functional theory and experimental validation analysis, the physical effects behind a possible electric field tuning captured via an effective Stark-like effect of the qubit response is due largely to a combination of distortion of the atomic/ionic lattice as well as direct field-induced shifts of the wave-functions, where the latter is expected to be greater. Owing to the high polarizability with dielectric constant of ~10 of SiC, the effects can be quite substantial and even stronger than that of diamond crystals.

The embodiments of the methods disclosed herein address the need to passivate the surface of a silicon carbide defect qubit device to protect the vacancy configuration and the need to integrate contacts that are optically transparent so that the qubit can be excited and the optical emission can be detectable from the regions beneath the contacts. The embodiments of the disclosed methods further address implementation of a layout where microwave power can be inputted at frequencies commensurate with the driving frequencies for the energy level of the transitions of the qubit system. The embodiments of the disclosed methods also provide the ability to apply electric field in the c-axis direction (i.e. between contact and bottom of wafer) as well as in two-dimensions, i.e. in the channel region between contacts.

The tunability of the qubits is enabled by utilizing the gates to immerse the qubits in an electric field and, by virtue of the Hamiltonian that is impacted, the qubit energy levels and spin transitions are modified. The tunability is also enabled by confining the qubit in an electrostatic potential created near the surface with a gate insulator sandwiched to further split the bands. For further control, the qubit can be embedded in the quantum well of a heterostructure formed between for example 4H SiC and Si or a crystalline insular with suitable energy barriers.

In order to understand the operation of the qubits and to quantify the anticipated tuning of the qubit properties, a spin Hamiltonian model is employed and it is modified to include a term in the Hamiltonian corresponding to electric field. The objective is to recalculate the effect of electric field on the energy levels and resulting ODMR spectra, to search for possibility of tuning the ODMR or even discovery of potential for new transitions if significant perturbation of the energy levels is expected. The Hamiltonian considered without electric field is $$H = g\mu_B \vec{B} \cdot \vec{S} + DS_z^2 + H_{hf} \tag{Eq. 1}$$

where g is the electron factor, $\mu_B$ is the Bohr magneton, $\vec{B}$ is the magnetic field, 2D is the zero-magnetic field splitting parameter, $\vec{S}$ is the vector of spin 3/2, and $H_{hf}$ is considering the hyperfine interaction between the next nearest neighbor (NNN) $^{29}$Si nuclear spin and the silicon vacancy (defect) spin. Looking at the full lattice description and full band-structure it is possible that other factors contribute to the overall response of the material, but for the atom-like description and the regime of excitation, these elements are the primary factors of interest to the Hamiltonian in this analysis in describing the system and the elements that can be engineered. Further details on the model can be found in a publication by Carter et al., titled "Spin Coherence and Echo Modulation of the Silicon Vacancy in 4H—SiC at Room Temperature", *Physical Review B*, vol. 92, issue 16 (2015), the content of which is fully incorporated by reference herein.

For the embodiments disclosed herein, an additional term is added to consider the effect of the electric field and to examine the impact on the energy levels as a function of magnetic field as well as the calculated optically detected magnetic resonance (ODMR) spectra. Based upon a recent publication by Falk et al., entitled "Optical Polarization of Nuclear Spins in Silicon Carbide," *Physical Review Letters*, vol. 2, issue 24 (2014), the content of which is fully incorporated by reference herein, the modified Hamiltonian becomes with the $H_{hf}$ term expanded to include electric field matrices.

$$H = g\mu_B \vec{B} \cdot \vec{S} + DS_z^2 + (H_{hf} - E_x(\sigma_x^2 - \sigma_y^2) + E_y(\sigma_x\sigma_y + \sigma_y\sigma_x)) \tag{Eq. 2}$$

where $E_x$ and $E_y$ are field splitting parameters in the x and y directions, respectively, and $\sigma_x^2$ and $\sigma_y^2$ are the respective components of the appropriate spin vector for the Si vacancy.

FIG. 3 shows calculated energy levels versus magnetic field with and without an additional electric field. Six transitions have been identified based on what is possible according to quantum mechanics for the spin 3/2 defects. FIGS. 4A-4F show graphs 100-150, respectively, of simulations of the ODMR spectra for these six transitions with and without an electric field. It is promising that significant sensitivity in the ODMR spectra is observable with nominal electric fields that would be readily resolvable in experiment.

Starting materials are 4" 4H and 6H purity semi-insulating silicon carbide, as well as 4" silicon control wafers for comparison. As an example, the wafers were diced into 19.5-x 19.5-mm squares. The size of the diced pieces may be varied based upon factors, such as, for example, ensuring compatibility with the thermal annealing furnace used in the process and making the source large enough to ensure that a device nears the center of the sample is minimally impacted by human wafer handling in the clean-room.

After dicing, 8 nm of silicon oxide (SiOx) was deposited by atomic layer deposition (ALD) to serve as an implant and annealing cap. ALD is beneficial in that it is performed at a low temperature and does not disrupt the qubit properties. It should be noted that different thicknesses of SiOx may be used other than 8 nm. The thickness may be optimized for the specific electric field, passivation protection, and/or alternating materials that are used to form the heterostructure. ALD was performed based on standard recipes using water and (x) precursors at 200° C., although it should be noted that other temperatures may be used. As an example, one method that may be used herein for producing defects is by ion implantation with $^{12}C$ and subsequent high temperature annealing with 900-1000° C. temperatures. Typical doses range from $10^{11}$-$10^{13}$ ions/cm$^2$ and energies greater than 20 keV. As an example, implantation may span these ranges as well as at 10 keV to attempt to position the vacancies closer to the surface of the SiC in order to have vacancies in regions of highest electric field. Table 1 below shows examples of ion-implantation for various wafers.

TABLE 1

| Wafer # | Species | Dose (cm$^{-2}$) | Energy (keV) | Samples |
| --- | --- | --- | --- | --- |
| 1 | $^{12}C$ | $10^{11}$ | 200 | 4H SiC, 6H SiC, Si |
| 2 | $^{12}C$ | $10^{12}$ | 200 | 4H SiC, 6H SiC, Si |
| 3 | $^{12}C$ | $10^{13}$ | 200 | 4H SiC, 6H SiC, Si |
| 4 | $^{12}C$ | $10^{11}$ | 50 | 4H SiC, 6H SiC, Si |
| 5 | $^{12}C$ | $10^{12}$ | 50 | 4H SiC, 6H SiC, Si |
| 6 | $^{12}C$ | $10^{13}$ | 50 | 4H SiC, 6H SiC, Si |
| 7 | $^{12}C$ | $10^{11}$ | 20 | 4H SiC, 6H SiC, Si |
| 8 | $^{12}C$ | $10^{12}$ | 20 | 4H SiC, 6H SiC, Si |
| 9 | $^{12}C$ | $10^{13}$ | 20 | 4H SiC, 6H SiC, Si |
| 10 | $^{12}C$ | $10^{11}$ | 10 | 4H SiC, 6H SiC, Si |
| 11 | $^{12}C$ | $10^{12}$ | 10 | 4H SiC, 6H SiC, Si |
| 12 | $^{12}C$ | $10^{13}$ | 10 | 4H SiC, 6H SiC, Si |

Figure 5:
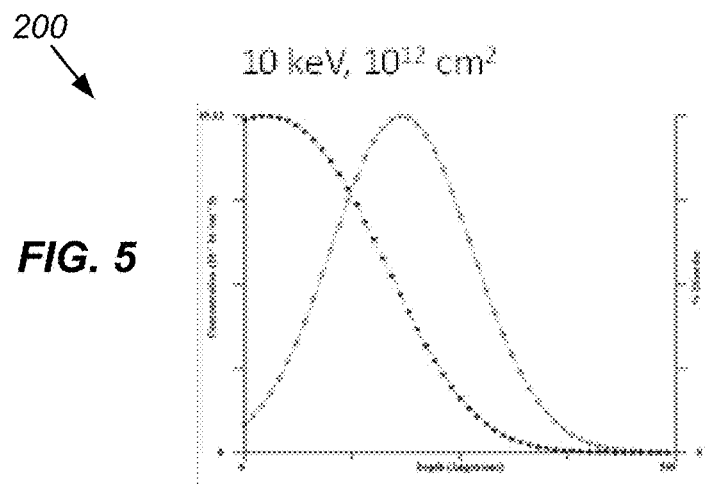
FIG. 5 shows a graph illustrating an ion implantation simulation of $^{12}C$ in silicon carbide for an implantation energy of 10 keV.
Figure 7:
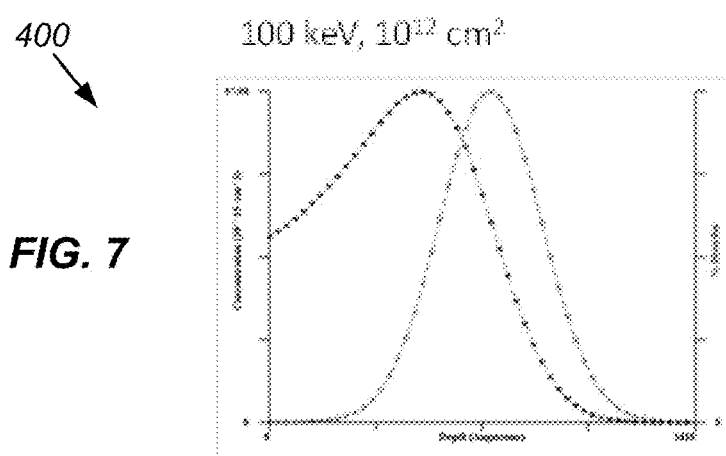
FIG. 7 shows a graph illustrating an ion implantation simulation of $^{12}C$ in silicon carbide for an implantation energy of 100 keV.
Figure 8:
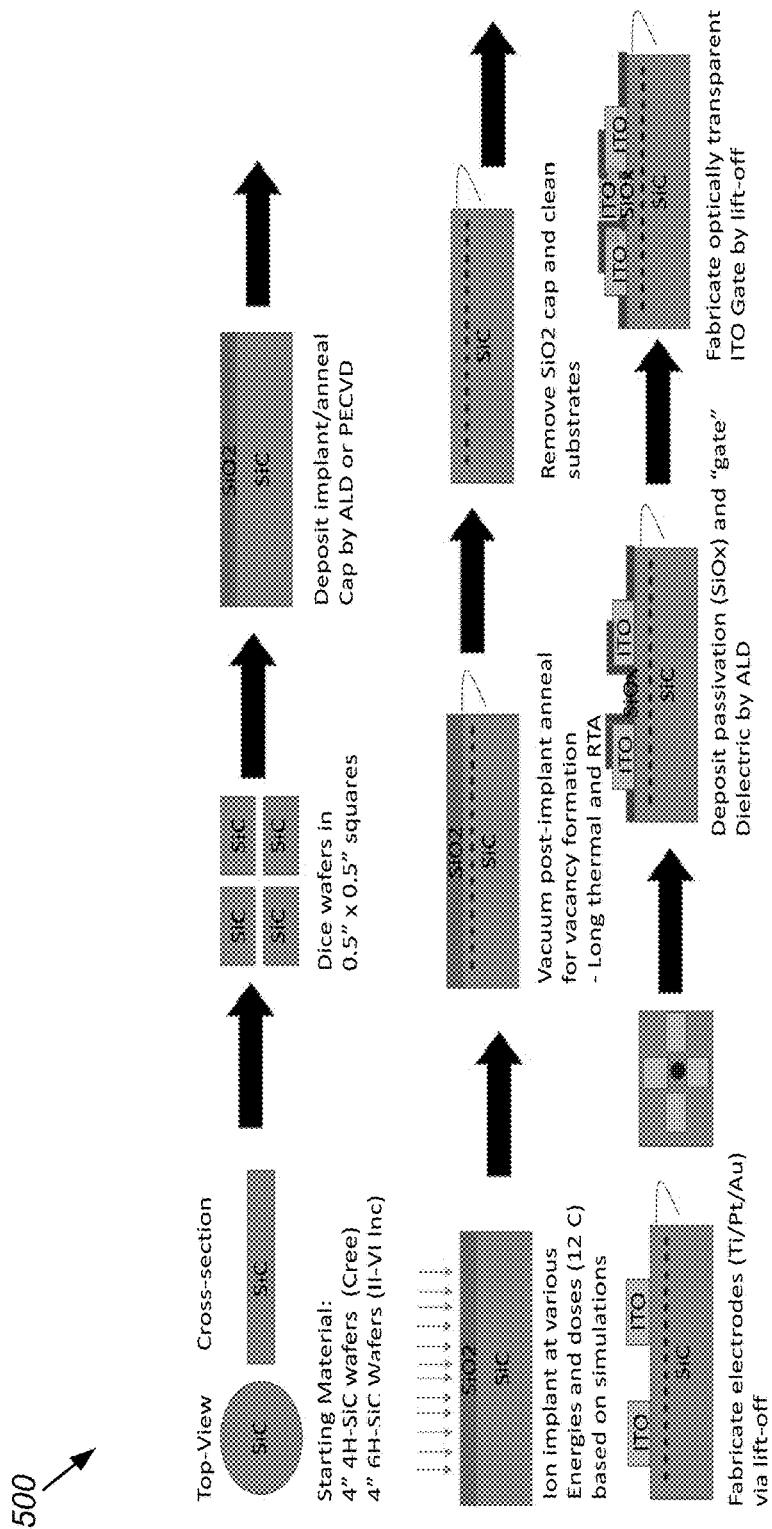
FIG. 8 shows a diagram illustrating the process flow for fabrication of a device in accordance with the disclosed embodiments.

The ion implantations were simulated to estimate the doping and damage profiles through the depth of the material. The estimations are shown in graphs 200, 300, and 400 shown in FIGS. 5-7, respectively, as an example with dose of $10^{12}$ cm$^{-2}$ and energies of 10, 20, and 100 keV. According to the simulations and prior to annealing, the peak concentration of $^{12}C$ is at 20.5, 41.3, and 188 nm. Depth of ion implantation depends on the desired location of the qubit and if there is any internationally formed heterojunction of photonic crystal buried beneath. In the absence of that, it is desired for the qubit to be located very near the surface to ensure maximum coupling of the electric field. Also according to the simulations, at the above-mentioned dose, a high level of disorder is created. However, some of the disorder may be resolved by the annealing process. For each wafer samples of 4H and 6H, silicon control was mounted by taping the corners with polyimide tape avoiding contact with the center 10 mm of the samples. After implantation the samples were processed according the flow diagram 500 shown in FIG. 8.

Thermal annealing was performed at 1000° C. for 30 minutes with a ULVAC MILA-3000 Mililamp annealer under low vacuum conditions. The thermal anneal is done to produce vacancies with a large percentage of vacancies that are suitable for use as qubits (i.e. silicon vacancies, and di-vacancies). However, other types of annealing, such as laser annealing, may be used. Following annealing, photolithography was performed to define lift-off regions for deposition of the electrodes. In one example, the mask contains field-effect device structures in a ground-signal-ground (G-S-G) configuration and with 150 μm separation, as shown in the finished product in FIG. 9. The "channel" length is varied on the mask ranging from 200 μm to 2 μm. Photolithography is completed with a MA6 mask aligner. After photolithography, a dilute H$_2$O:HF (1:50) etch is performed to etch the SiO$_x$ in the contact regions. After etch, deposition of ITO occurs by, for example, RF sputtering at 200 Watts in argon.

After sputtering, a first lift-off operation is performed in acetone with ultrasonic agitation. As used herein, the term "lift-off" refers to the process in semiconductor wafer manufacturing of creating patterns on the wafer surface through an additive process, as opposed to the more familiar patterning techniques that involve subtractive processes, such as etching.

The process then involves depositing a passivation and gate silicon oxide layer on top of the layer of silicon carbide and the electrodes, as well as performing a second lift-off operation to fabricate an optically transparent ITO gate between the electrodes. As used herein, the term "optically transparent" refers to transparency that permits both the excitation and emission of the desired wavelengths for the qubit operation. These two steps form a gate electrode directly above the qubit region in intimate contact with the SiOx passivation. A lift-off procedure may also be used following deposition of a transparent electrode, such as ITO.

Figure 9:
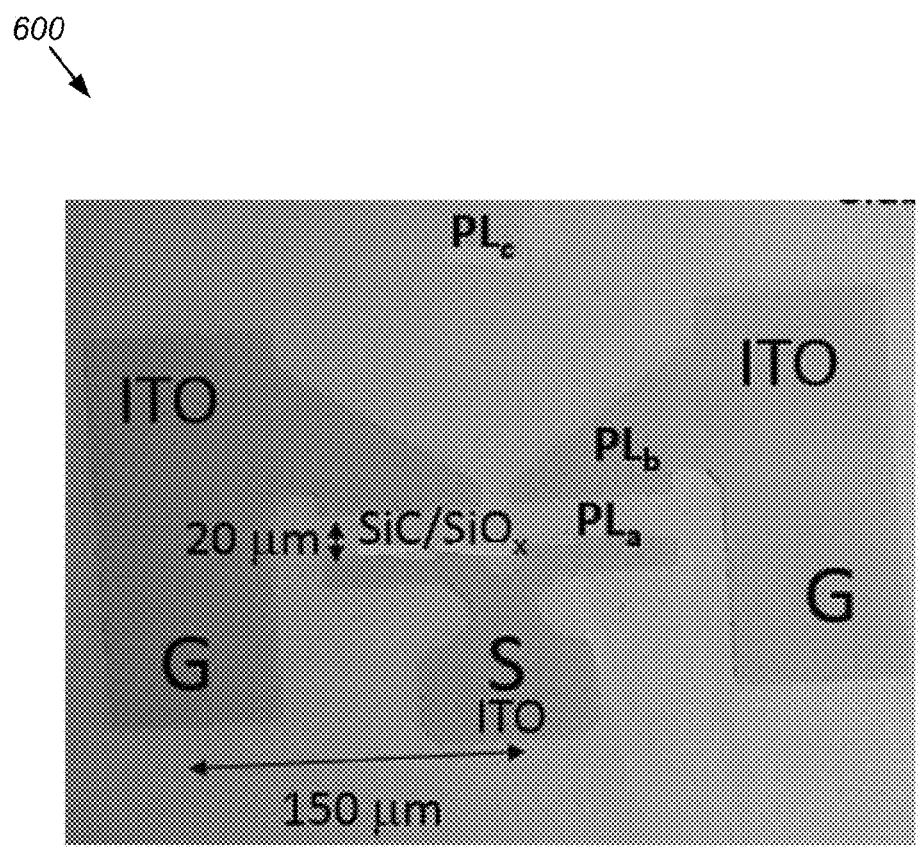
FIG. 9 shows a top-down optical micrograph view of a representative device, in a ground-signal-ground configuration, fabricated in accordance with the embodiments of the method disclosed herein.

The output 600 is shown in FIG. 9, showing several ITO electrodes and noting three regions where photoluminescence (PL) measurements are taken, namely PL$_a$, PL$_b$, and PL$_c$. The layout is in a ground-signal-ground (GSG) configuration spaced by 150 μm suitable for direct microwave input via probes.

As an example, scanning PL measurements were taken on both of the 4H—SiC and 6H—SiC samples at room temperature using an AIST-NT Confocal Raman/Atomic Force Microscopy (AFM) system with a laser excitation source of 785 nm, a Horiba iHR320 imaging spectrometer, and a Horiba Syncerity CCD camera thermoelectrically cooled to −50° C. with a Hamamatsu (S11510) near-IR image sensor. The samples measured include both non-implanted and $^{12}C$ implanted 4H—SiC and 6H—SiC with energies ranging from 20-50 keV and doses ranging from $10^{12\text{-}13}$. Measurements were also conducted on three different regions of the device to examine the effect of an ITO film on the excitation and transmission of SiC PL.

Figure 10:
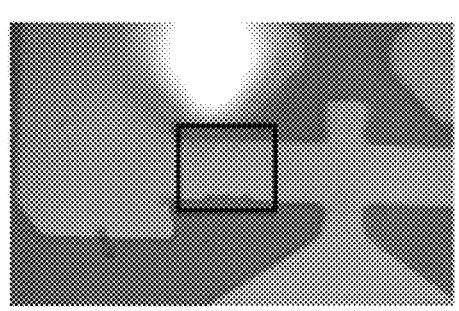
FIG. 10 shows a scanning photoluminescence measurement of a device channel region for a 6H silicon carbide device implanted at 50 keV and a dose of $10^{13}$.
Figure 11:
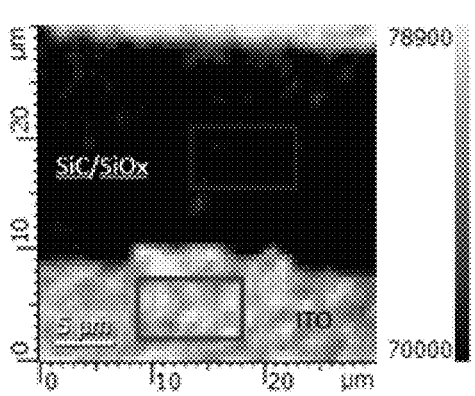
FIG. 11 shows a photoluminescence image of the scanned region where the color of each data point is assigned based on the area-under-the-curve spanned by the markers in FIG. 12.

FIG. 10 shows the scanning PL image 700 of the device channel region, PL$_a$ for a 6H—SiC device implanted at 50 keV and a dose of $10^{13}$. FIG. 11 shows a PL image 800 of the scanned region where the color of each data point is assigned based on the area-under-the-curve (AUC) spanned by the green markers shown in graph 900 of FIG. 12. The region is a 30 μm by 30 μm square and the spectra were acquired every 500 nm with an acquisition time of 100 ms using a 30 mW excitation at 785 nm.

Figure 12:
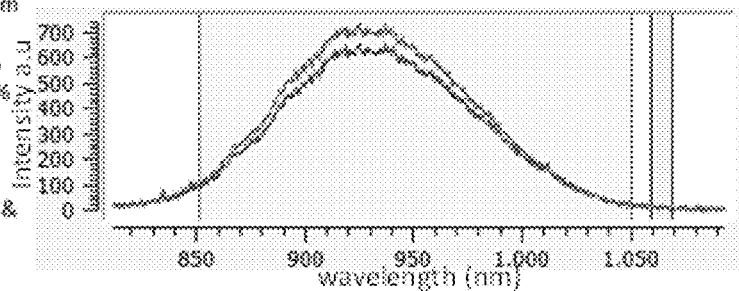
FIG. 12 shows a graph illustrating the average spectra of the spectra encompassed by the regions shown in FIG. 11.

The blue and red spectra shown in FIG. 12 are the average spectra of the spectra encompassed by the blue and red regions, respectively, shown in image 800 of FIG. 11. The blue region corresponds to 6H—SiC/SiO$_x$ within the device channel and the red region corresponds to 6H—SiC/ITO/SiO$_x$. The broad PL peak in FIG. 11 spanning 825-1050 nm is suggestive of silicon vacancy defects in 6H—SiC. As these measurements were completed at room temperature, the PL shows a broad phonon sideband. In order to lessen the effect of electron-phonon coupling and to observe the sharp zero phonon line transitions of the defects, the device must be cooled. Additionally, small peaks corresponding to the tangential and longitudinal optical modes (TO, LO, respectively) of 6H—SiC are present ($\approx$830-850 nm). The suggests that ITO has minimal impact on the transmission of the PL as confirmed by similar PL intensities and presence of 6H—SiC Raman peaks in the 6H—SiC/SiO$_x$ and 6H—SiC/ITO/SiOx regions.

Figure 13:
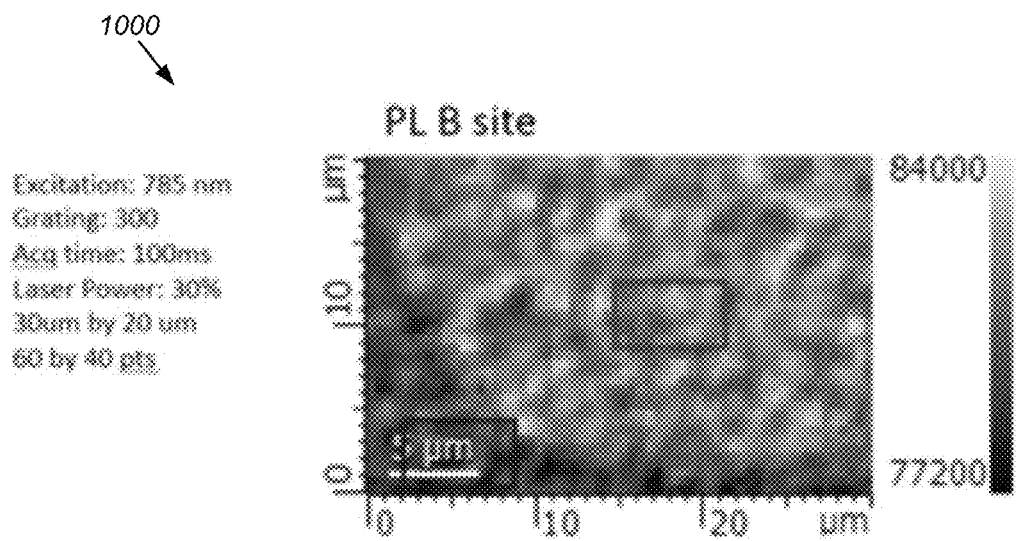
FIG. 13 shows a photoluminescence image taken in the $PL_B$ region of the device shown in FIG. 9.
Figure 14:
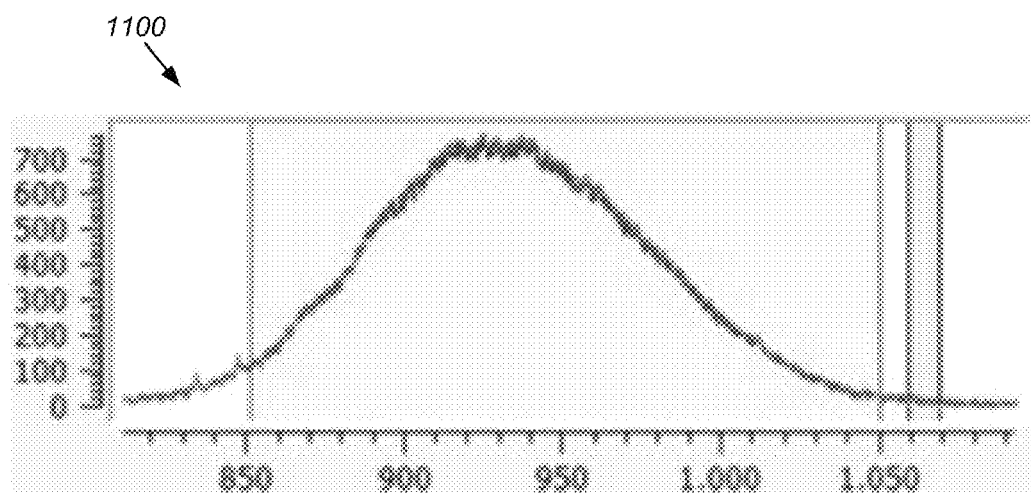
FIG. 14 shows a graph illustrating the averaged spectra of the data points within the boxed regions shown in FIG. 13.

FIG. 13 shows a scanning PL image 1000 of the ITO electrode region, PL$_B$, for a 6H—SiC device implanted at 50 keV and a dose of $10^{13}$. FIG. 13 shows a PL image of the scanned region where the color of each data point is assigned based on the area-under-the-curve (AUC) spanned by the green markers of graph 1100 shown in FIG. 14. The region is a 30 μm by 20 μm and the spectra were acquired every 500 nm with an acquisition time of 100 ms using a 30 mW excitation at 785 nm. The blue and red spectra shown in graph 1100 are the average spectra of the spectra encompassed by the blue and red regions, respectively, of image 1000 shown in FIG. 13. Both the blue and the red region correspond to 6H—SiC/ITO/SiO$_x$. The spectra shown in FIG. 14 correspond closely with the spectra shown in FIG. 12, as the ITO film appears to have minimal impact on observing the PL of 6H—SiC.

Figure 15:
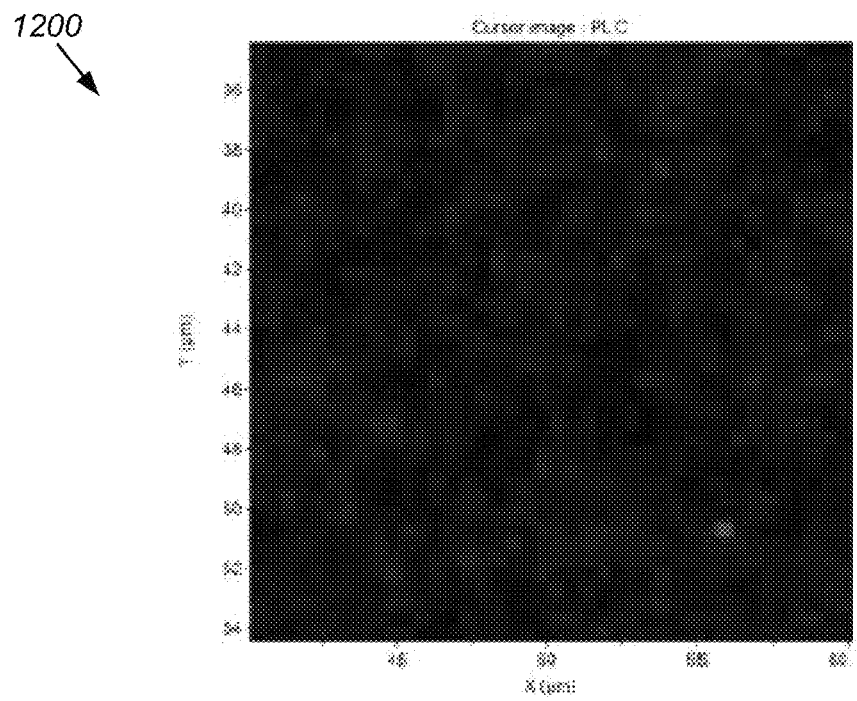
FIG. 15 shows a photoluminescence image taken in the $PL_C$ region of the device shown in FIG. 9.
Figure 16:
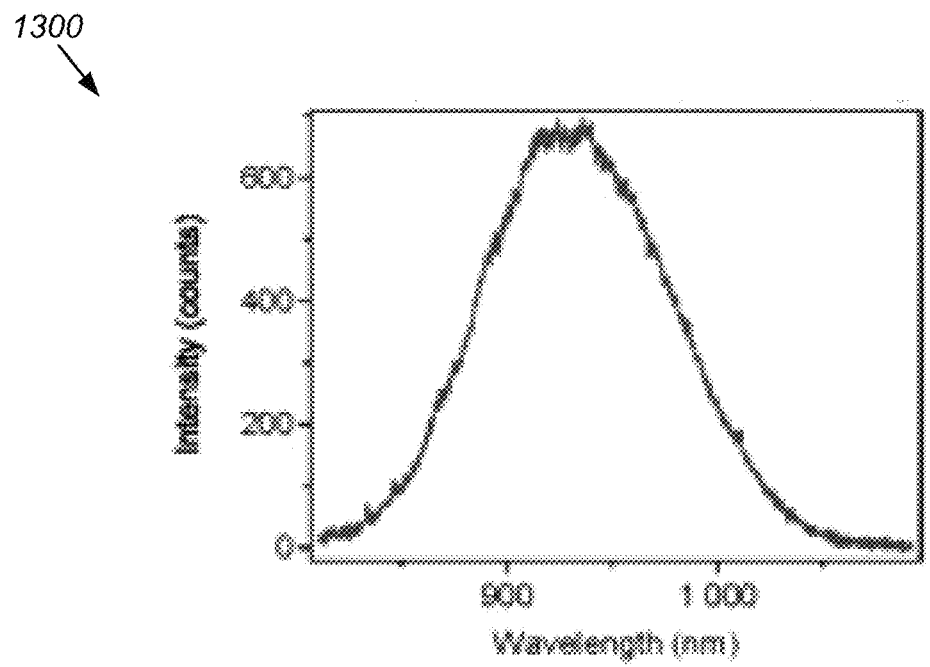
FIG. 16 shows a graph illustrating the averaged spectra of the data points within the entire scanned region shown in FIG. 15.

FIGS. 15 and 16 show the scanning PL measurement of the 6H—SiC/SiO$_x$ region away from the device, PL$_C$, implanted at 50 keV and a dose of $10^{13}$. FIG. 15 shows a PL image 1200 of the scanned region where the color of each data point is assigned based on the maximum peak intensity of the collected spectra. The region is a 20 μm by 20 μm and the spectra were acquired every 500 nm with an acquisition time of 100 ms using a 30 mW excitation at 785 nm. FIG. 16 shows a graph 1300 illustrating the average spectrum of the entire region. Comparing the spectra of FIGS. 12, 14, and 16 demonstrates that the ITO and SiO$_x$ films have minimal impact on observing the PL of 6H—SiC and that the PL is nearly uniform between different regions of the sample.

Figure 17:
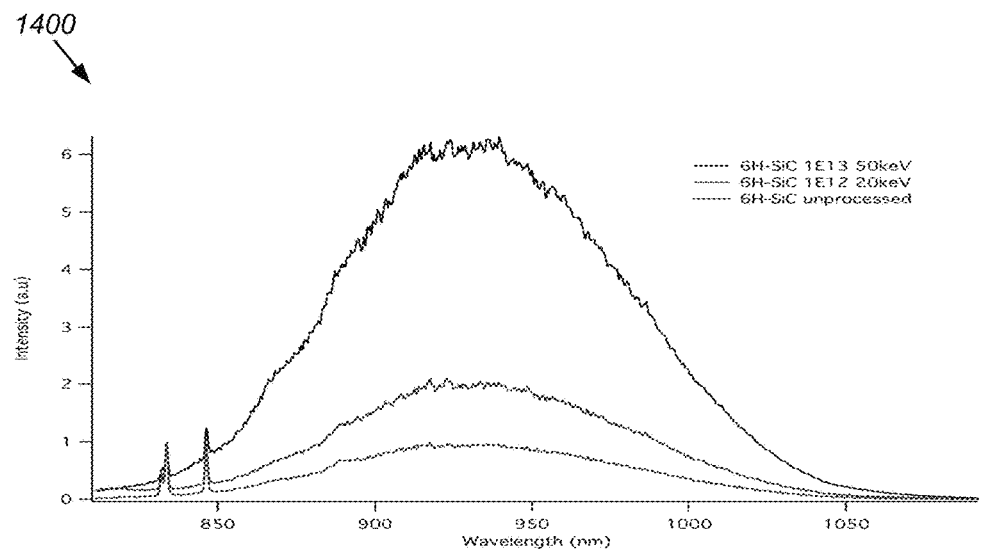
FIG. 17 shows a graph illustrating spectra of 6H—SiC samples with varying implantation energies and doses normalized with respect to the $2^{nd}$ TO Raman peak of 6H—SiC.

To confirm the effect of energy and dose in introducing defects in 6H—SiC, the PL measurements were conducted on three samples. These samples included unprocessed 6H—SiC, 6H—SiC implanted at 20 keV with dose of $10^{12}$, and 6H—SiC implanted at 50 keV with dose of $10^{13}$. The samples were measured using a 785 nm excitation at 100 mW. The average spectra were acquired with an acquisition time of 1s and 10 accumulations, and were normalized with respect to the $2^{nd}$ TO peak of 6H—SiC. FIG. 17 shows a graph 1400 illustrating the average spectra of these measurements. With increasing dose and energy, the PL intensity increases indicative of increased number of defects in 6H—SiC.

Figure 18:
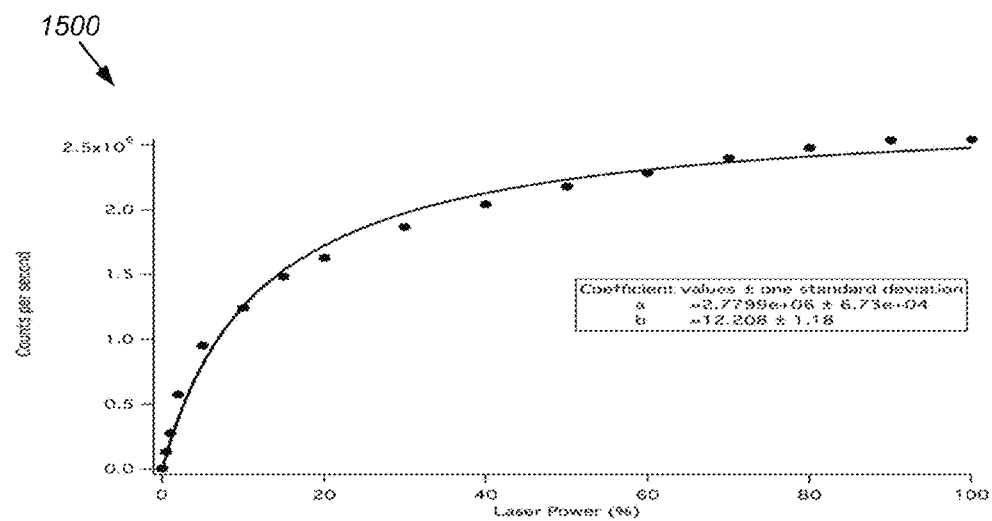
FIG. 18 shows a graph illustrating PL emission versus laser power for a 6H—SiC sample implanted at 50 keV and a dose of $10^{13}$.

To estimate the quantity of photon emitting defects within the excitation volume, the PL of an implanted 6H—SiC sample (Energy: 50 keV; Dose: $10^{13}$) was measured at a series of laser powers. FIG. 18 shows a graph 1500 illustrating the counts per second (cps) of the PL with respect to laser power from 0 to 100 mW. The data was fit to the equation $f(x)=a/(1+(b/x))$ where "a" corresponds to the cps when all emitters within the volume are saturated and "b" corresponds to the laser power to achieve half of the saturated emission. Using an estimated $10^4$ cps for a single emitter, the estimated emitters within the excitation volume is $\approx$300. By varying the dose and energy of implantation, it may be possible to the decrease the number of emitting defects to achieve devices with single defects.

Figure 19:
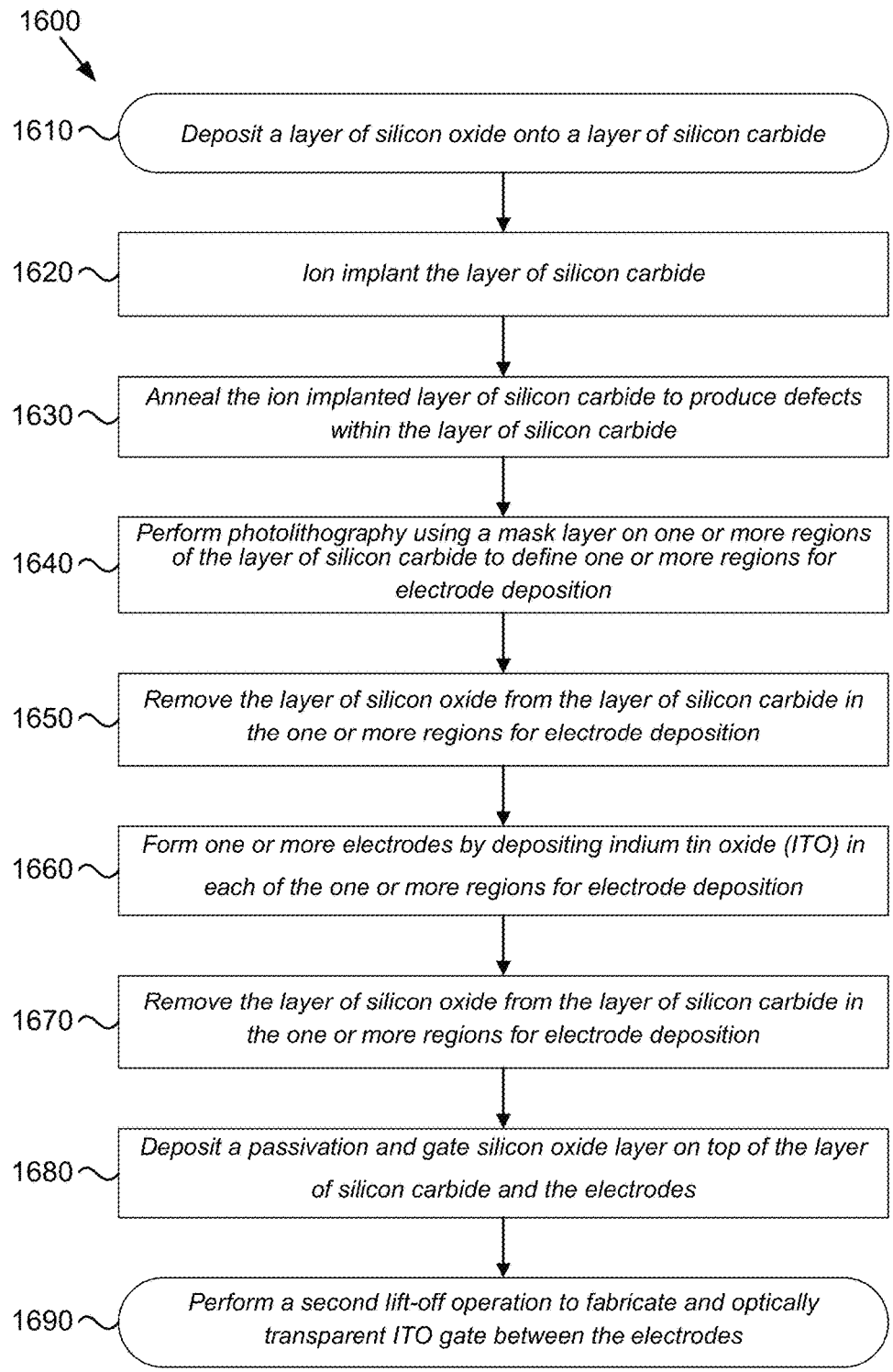
FIG. 19 shows a flowchart of an embodiment of a method in accordance with the embodiments disclosed herein.

FIG. 19 shows a flowchart of an embodiment of a method 1600 in accordance with the embodiments disclosed herein. While FIG. 19 shows one embodiment of method 100 to include steps 110-180, other embodiments of method 1600 may contain fewer or more steps. Further, while in some embodiments the steps of method 1600 may be performed as shown in FIG. 19, in other embodiments the steps may be performed in a different order, or certain steps may occur simultaneously with one or more other steps.

Method 1600 may begin with step 1610, which involves depositing a layer of silicon oxide onto a layer of silicon carbide, such as 4H or 6H silicon carbide. Step 1620 involves ion implanting the layer of silicon carbide. As an example, step 1620 is performed using $^{12}C$. In some embodiments, step 1620 is performed using an energy level between a range of about 20 keV to about 50 keV. Step 1630 involves annealing the ion implanted layer of silicon carbide to produce defects within the layer of silicon carbide. In some embodiments, step 1630 is performed at a temperature between a range of about 900 degrees Celsius to about 1000 degrees Celsius.

Step 1640 involves performing photolithography using a mask layer on regions of the layer of silicon carbide to define regions for electrode deposition. Step 1650 involves removing the layer of silicon oxide from the layer of silicon carbide in the one or more regions for electrode deposition. In some embodiments, step 1650 is performed using a dilute H$_2$O:HF etch. Step 1660 involves forming one or more electrodes by depositing indium tin oxide (ITO) in each of the regions for electrode deposition. As an example, step 1660 is performed by RF sputtering at 200 W in argon.

Step 1670 involves performing a first lift-off operation to remove the mask layer surrounding the electrodes. In some embodiments, step 1670 is performed in acetone with ultrasonic agitation. Step 1680 involves depositing a passivation and gate silicon oxide layer on top of the layer of silicon carbide and the electrodes. In some embodiments, step 1680 is performed by atomic layer deposition. Step 1690 involves performing a second lift-off operation to fabricate an optically transparent ITO gate between the electrodes.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A method comprising the steps of:
   depositing a layer of silicon oxide onto a layer of silicon carbide;
   ion implanting the layer of silicon carbide;
   annealing the ion implanted layer of silicon carbide to produce defects within the layer of silicon carbide;
   performing photolithography using a mask layer on one or more regions of the layer of silicon carbide to define one or more regions for electrode deposition;

removing the layer of silicon oxide from the layer of silicon carbide in the one or more regions for electrode deposition;

forming one or more electrodes by depositing indium tin oxide (ITO) in each of the one or more regions for electrode deposition;

performing a first lift-off operation to remove the mask layer surrounding the electrodes;

depositing a passivation and gate silicon oxide layer on top of the layer of silicon carbide and the electrodes; and performing a second lift-off operation to fabricate an optically transparent ITO gate between the electrodes.

2. The method of claim 1, wherein the step of ion implanting is performed using $^{12}$C.

3. The method of claim 1, wherein the step of ion implanting is performed using an energy level between a range of about 20 keV to about 50 keV.

4. The method of claim 1, wherein the step of annealing is performed at a temperature between a range of about 900 degrees Celsius to about 1000 degrees Celsius.

5. The method of claim 1, wherein the step of removing the layer of silicon oxide from the layer of silicon carbide is performed using a dilute $H_2O$:HF etch.

6. The method of claim 1, wherein the step of depositing ITO is performed by RF sputtering at 200 W in argon.

7. The method of claim 1, wherein the step of performing a first lift-off operation is performed in acetone with ultrasonic agitation.

8. The method of claim 1, wherein the step of depositing a layer of silicon oxide onto a layer of silicon carbide is performed by atomic layer deposition.

9. The method of claim 1, wherein the layer of silicon carbide comprises 4H silicon carbide.

10. The method of claim 1, wherein the layer of silicon carbide comprises 6H silicon carbide.

11. A method comprising the steps of:

depositing a layer of silicon oxide onto a layer of silicon carbide using atomic layer deposition;

ion implanting the layer of silicon carbide using $^{12}$C using an energy level between a range of about 20 keV to about 50 keV;

annealing the ion implanted layer of silicon carbide at a temperature between a range of about 900 degrees Celsius to about 1000 degrees Celsius to produce defects within the layer of silicon carbide;

performing photolithography on one or more regions of the layer of silicon carbide to define one or more regions for electrode deposition;

removing the layer of silicon oxide from the layer of silicon carbide in the one or more regions for electrode deposition using a dilute $H_2O$:HF etch;

depositing indium tin oxide (ITO) in each of the one or more regions for electrode deposition;

performing a first lift-off operation to remove the mask layer surrounding the electrodes;

depositing a passivation and gate silicon oxide layer on top of the layer of silicon carbide and the electrodes; and performing a second lift-off operation to fabricate an optically transparent ITO gate between the electrodes.

12. The method of claim 11, wherein the step of depositing ITO is performed by RF sputtering at 200 W in argon.

13. The method of claim 1, wherein the step of performing a first lift-off operation is performed in acetone with ultrasonic agitation.

14. The method of claim 1, wherein the layer of silicon carbide comprises one of 4H silicon carbide and 6H silicon carbide.

15. A method comprising the steps of:

depositing a layer of silicon oxide onto a layer of silicon carbide using atomic layer deposition, wherein the layer of silicon carbide comprises one of 4H silicon carbide and 6H silicon carbide;

ion implanting the layer of silicon carbide using $^{12}$C using an energy level between a range of about 20 keV to about 50 keV;

annealing the ion implanted layer of silicon carbide at a temperature between a range of about 900 degrees Celsius to about 1000 degrees Celsius to produce defects within the layer of silicon carbide;

performing photolithography on one or more regions of the layer of silicon carbide to define one or more regions for electrode deposition;

removing the layer of silicon oxide from the layer of silicon carbide in the one or more regions for electrode deposition using a dilute $H_2O$:HF etch;

depositing indium tin oxide (ITO) in each of the one or more regions for electrode deposition using RF sputtering at 200 W in argon;

performing a first lift-off operation to remove the mask layer surrounding the electrodes by using acetone with ultrasonic agitation;

depositing a passivation and gate silicon oxide layer on top of the layer of silicon carbide and the electrodes; and performing a second lift-off operation to fabricate an optically transparent ITO gate between the electrodes.

* * * * *